July 24, 1956 E. H. HUGENHOLTZ 2,756,333
AUTOMATIC FREQUENCY CONTROL
Filed Sept. 25, 1952
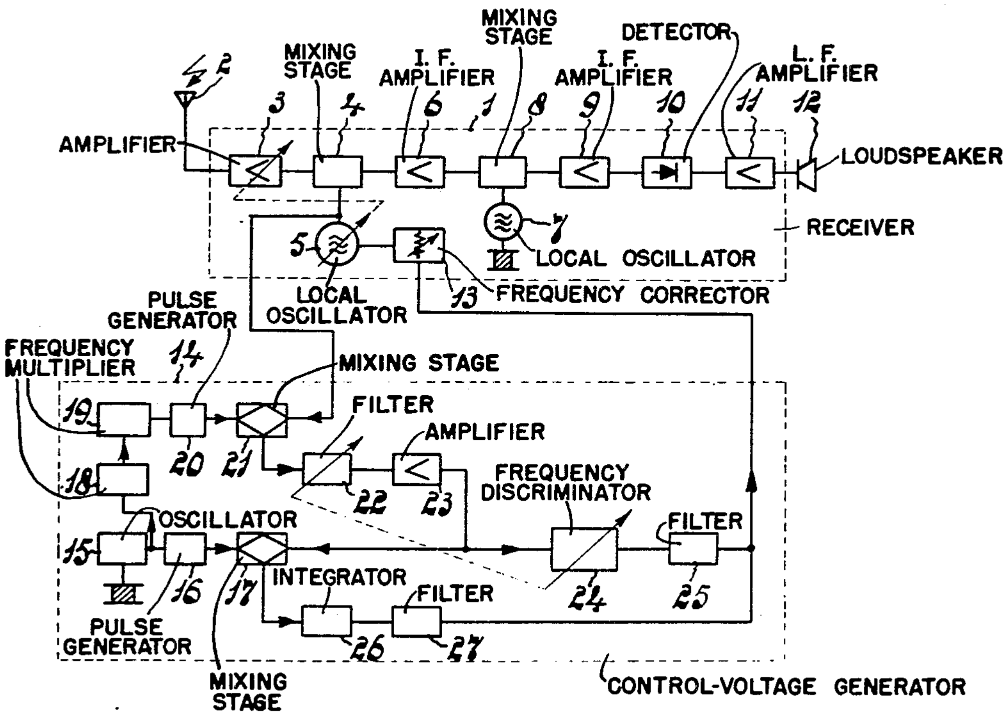
INVENTOR
Eduard Herman Hugenholtz
BY
Fred M. Vogel
AGENT United States Patent Office 2,756,333
Patented July 24, 1956

2,756,333

AUTOMATIC FREQUENCY CONTROL

Eduard Herman Hugenholtz, Hilversum, Netherlands, assignor to Hartford National Bank and Trust Company, Hartford, Conn., as trustee Application September 25, 1952, Serial No. 311,422

Claims priority, application Netherlands September 27, 1951

3 Claims. (Cl. 250—36)

The present invention relates to a superheterodyne receiver, which is tunable in coarse steps and in fine steps to different communication frequencies and comprises means for automatic stabilization of the tuning frequencies with respect to stabilizing oscillations.

It is known to construct such receivers in the form of double superheterodyne receivers, in which the first local oscillator is adjustable in coarse steps and the second local oscillators in fine steps and to stabilize these oscillators automatically in frequency with respect to stabilizing oscillations. In this case, it is necessary to provide for a first intermediate-frequency amplifier of the receiver which is either tunable in steps or to use a wide-band amplifier. Both solutions give rise to difficulties in practice.

According to the present invention a superheterodyne receiver comprising a local oscillator tunable in coarse steps and in fine steps, provided with a frequency corrector to be controlled by a control-voltage for automatic stabilization of the oscillator frequency with respect to stabilizing oscillations, the control-voltage being taken from a control-voltage generator, comprises a first normally cut-off pulse mixing stage, in which the oscillator voltage to be stabilized is mixed with stabilizing pulses periodically releasing the mixing stage, from which is taken a beat frequency, which is supplied through a selective filter to a second, normally cut-off pulse mixing stage, in which the beat frequency is mixed with stabilizing pulses which periodically release this mixing stage and have a recurrence frequency which is a subharmonic of the recurrence frequency of the stabilizing pulses supplied to the first mixing stage, the stabilizing oscillations supplied to the two pulse mixing stages being taken from a single stable oscillator.

With respect to interference whistle the circuit-arrangement in accordance with the present invention has been found to be particularly sensitive to very slight divergencies (of, for example, 0.5 to 1 cycle per second) from a harmonic frequency relation between the stabilizing oscillations of, for example, 0.1 and 1 megacycle per second; this is in contradistinction to superheterodyne receivers of the known type described above, in which the first and the second local oscillators are tunable and stabilized on relatively independent oscillations.

On the other hand, it has been found with the circuit-arrangement in accordance with the invention that it is not necessary to pay particular attention to a rigid phase relationship between the stabilizing oscillations. Accordingly, it is not necessary to use automatic frequency-stabilization circuits, responding to phase differences in order to maintain a harmonic frequency relationship between the stabilizing oscillations; it may thus suffice to use simple frequency-multiplying circuits to maintain the desired harmonic frequency relationship.

Preferably with the use of, for example, a crystal-controlled stable oscillator a sinusoidal oscillation is produced, which governs a pulse generator for the stabilizing pulses of lower recurrence frequency and is also supplied to a distorting amplifying stage, operating as a frequency multiplier, from which is taken a sinusoidal oscillation which governs a pulse generator for the stabilizing pulses of higher recurrence frequency.

In order that the inveniton may be more clearly understood and readily carried into effect, it will now be described more fully with reference, by way of example, to the accompanying drawing, in which a superheterodyne receiver in accordance with the invention is shown in block diagram schematic form.

The receiver 1 is constructed in the form of a double superheterodyne receiver. The oscillations received through the aerial 2 are supplied, via a tunable high-frequency preamplifier 3, to a mixing stage 4, to which is also connected a tunable first local oscillator 5. The intermediate-frequency oscillations taken from the mixing stage 4 are supplied, through a fixed-tuned first intermediate-frequency amplifier 6, to a second mixing stage 8, connected to a fixed-tuned, crystal-controlled, second local oscillator 7, in order to produce intermediate-frequency oscillations to be amplified in a fixed-tuned second intermediate-frequency amplifier 9. A detector 10, connected to the second intermediate-frequency amplifier 9, furnishes demodulated oscillations, which are supplied through a low-frequency amplifier 11, to a loud-speaker 12.

The receiver 1 is tunable in a range of, for example, 20 to 40 megacycles per second, in coarse steps of multiples of 1 megacycle per second and in fine steps of multiples of 0.1 megacycle per second. Adjustments of the receiver requiring a tuning of the first local oscillator to multiples of 0.5 megacycle per second are hereinafter, for the sake of simplicity, left out of consideration, since with the numerals taken in the example complications would occur, which are not essential for a good understanding of the present invention and therefore need not be explained.

The receiver is tuned to a desired communication channel by tuning the first local oscillator 5 with an accuracy of about 20 to 80 kilocycles per second to the desired frequency, for example, by means of a pawl-locking mechanism, after which automatic correction and stabilization of the oscillator frequencies occurs by means of, for example, a frequency corrector 13, such as a reactance tube. This frequency corrector is controlled by a control-voltage from a control-voltage generator 14. A difference of, for example, 4.2 megacycles per second prevails between the tuning frequency of the receiver (i. e. of the high-frequency pre-amplifier 3) and the first local oscillator 5, which difference corresponds to the first intermediate-frequency of the receiver. If the communication frequency to be received is, for example, 31 megacycles per second, the first local oscillator 5 of the receiver should supply a frequency of 31−4.2=26.8 megacycles per second. Irrespective of the communication frequency in the given range of 20 to 40 megacycles per second, the first local oscillator 5 is stabilized with respect to control-frequencies by means of the control-voltage generator 14, which comprises known elements (cf. U. S. Patent 2,574,482, issued November 13, 1951, to Hugenholtz) and which operates as follows:

A crystal-controlled oscillator 15 generates a sine voltage having a frequency of 0.1 megacycle per second, which governs a pulse generator 16, the latter thereby supplying short pulses (duty-cycle at the most, for example 1/30 to 1/100), having a recurrence frequency of 0.1 megacycle per second. These pulses release for short periods a normally cut-off pulse mixing stage 17. The sine voltage is also supplied to a distorting amplifying stage 18, operating as a frequency multiplier in order to produce a sine oscillation of 0.5 megacycle per second. The output oscillation of the frequency multiplier 18 is supplied to a second frequency multiplier 19 to produce a sine wave oscillation of 1 megacycle per second, which is converted by the pulse generator 20 into short pulses (duty-cycle for example at the most 1/50 to 1/100) having a recurrence frequency of 1 megacycle per second. The 1 megacycle per second stabilizing pulses thus obtained release for short periods an additional normally cut-off pulse mixing stage 21 to which the oscillator frequency to be stabilized of, about 26.8 megacycles per second, is also supplied. The latter frequency is mixed with the 25 megacycles per second harmonic of the 1 megacycle per second pulses and thus a beat frequency of about 1.8 megacycles per second is generated which is separated by a selective filter 22 from further beat frequencies produced in the mixing stage and is supplied to an amplifier 23. In the present example this filter 22 is tunable in steps of 0.1 megacycle per second between 1.1 to 1.9 megacycles per second, however, it can not be tuned to 1.5 megacycles per second. It should be noted here that the tunable selective filter 22 may be replaced by a fixedly tuned bandpass filter, if the output circuit of the pulse mixing stage 21 has to pass only beat frequencies of 1.5 to 1.9 megacycles per second.

The beat frequency of about 1.8 megacycles per second taken from the amplifier 23 is supplied to a frequency discriminator 24, preferably of the band-pass filter type, and to the pulse mixing stage 17, operating as a phase discriminator (phase detector). The latter two discriminators are of a known type and provide a coarse and a fine adjustment of the frequency to be stabilized, respectively.

The frequency discriminator 24 may be tuned, together with the filter 22, in the range of 1.1 to 1.9 megacycles per second in steps of 0.1 megacycle per second (with the exception of 1.5 megacycles per second) and supplies, through a smoothing filter 25, a direct control-voltage to the frequency corrector 13 of the first local oscillator 5. This voltage is positive or negative according as the beat frequency (and, consequently, the frequency of the oscillator 5 to be stabilized) is higher or lower than the desired frequency, in the present case, 1.8 megacycles per second. As is known, a frequency discriminator furnishes only a control-voltage if there is a certain frequency divergence, so that it cannot reduce frequency divergences to zero. This may, however, be effected by providing the phase discriminator 17, to which stabilizing pulses having a recurrence frequency of 0.1 megacycle per second are supplied. This phase discriminator becomes automatically operative as soon as the frequency difference between the beat frequency applied (in the present case 1.8 megacycles per second and a harmonic of the control-pulses in the present case the 1.8 megacycles per second harmonic) becomes lower than the frequency range of, for example, 0.5 to 10 kilocycles per second. Then the output voltage of the pulse mixing stage 17, which is supplied through a network 26, integrating the output pulses and a low bandpass filter 27, together with the output voltage of the smoothing filter 25, to the frequency corrector 13 of the transmitter oscillator 5, provides a locking of the frequencies obtained by means of a direct control-voltage varying with the phase relationship between the voltages compared (in the present case 1.8 megacycles per second beat frequency and the 1.8 megacycles per second harmonic of the 0.1 megacycle per second stabilizing pulses). The frequency of the stabilized oscillator 5 is then held accurately at the desired frequency of 26.8 megacycles per second, i. e. at the sum of the frequencies of the 25 megacycles per second harmonic of the 1 megacycle per second stabilizing pulses occurring across the pulse mixing stage 21 and the 1.8 megacycles per second harmonic of the 0.1 megacycle per second stabilizing pulses supplied to the pulse mixing stage 17.

The operation of the control-voltage generator 14 remains unchanged, if the receiver is tuned to another communication channel, differing from 31 megacycles per second. If the desired communication frequency is, for example, 24.5 megacycles per second, the local oscillator 5 is tuned to approximately 20.3 megacycles per second and the filter 22 and the frequency discriminator 24 to 1.3 megacycles per second. This oscillator frequency together with the 19 megacycles per second harmonic of the 1 megacycle per second stabilizing pulses in the pulse mixing stage 21 causes a beat frequency of about 1.3 megacycles per second. The frequency discriminator 24 tuned to this beat frequency then furnishes a control voltage for coarse adjustment of the frequency of the oscillator 5 and comparison of the 1.3 megacycles per second beat frequency with the 1.3 megacycles per second harmonic of the 0.1 megacycle per second stabilizing pulses in the mixing stage 17 furnishes a control-voltage for fine adjustment to 20.3 megacycles per second.

In the control-voltage generator described above the pulse generator 20 and the pulse mixing stage 21, or the pulse generator 16 and the pulse mixing stage 17 may be united by providing the pulse mixing stage 21 or 17 respectively with a special tube, i. e. a cathode-ray tube. From the frequency multiplier 19 or the oscillator 15 respectively is then taken a sine wave voltage of 1 megacycle per second or 0.1 megacycle per second respectively, which is used for a deflection of the electron beam in the cathode ray tube such that the beam strikes a strip-shaped collecting electrode once only in each period of the deflection voltage. Thus the collecting electrode carries current pulses, which have a pulse recurrence frequency of 1 megacycle per second, or 0.1 megacycle per second, respectively. By supplying the oscillator voltage to be corrected in frequency or the beat frequency to an intensity-control electrode of the cathode-ray tube, the current pulses at the collecting electrode are modulated by the oscillator voltage or the beat voltage respectively as in the pulse mixing stage 21 or 17, respectively. For details of pulse mixing stages constructed in the form of cathode-ray tubes reference is made to U. S. patent application Serial No. 149,692, filed March 15, 1950.

It should be noted here that, when using the invention, the same control-voltage generator may be used for different types of receivers, for example, for amplitude modulation and frequency-modulation reception. Without modification of the control-voltage generator, a receiver tunable within another frequency range of, for example, 40 to 60 megacycles per second or 60 to 80 megacycles per second may also be used, provided that the stabilizing pulses supplied to the pulse mixing stage 21 have a sufficiently short duration. Of course, in this case the frequency corrector 13 of the receiver must be adjusted in accordance with the desired tuning of the local oscillator 5.

With the embodiment described above a double superheterodyne receiver is used but the invention may also be used with receivers constructed in the form of single superheterodyne receivers.

It is to be understood that the invention is not limited to the details disclosed but includes all such variations and modifications as fall within the spirit of the invention and the scope of the appended claims.

What I claim is:

1. In a superheterodyne receiver, apparatus comprising a local oscillator tunable in coarse and fine steps and provided with a frequency corrector, and a control voltage generating device comprising a first normally cut-off pulse mixing stage, circuit means including a stable oscillator for applying stabilizing pulses to said stage to periodically release same, means for applying oscillations from said local oscillator to said stage to mix therein with said stabilizing pulses to produce a beat frequency, a second normally cut-off pulse mixing stage, means including said stable oscillator for applying additional stabilizing pulses to said second stage to periodically release same, said additional stabilizing pulses having a recurrence frequency which is a subharmonic of the recurrence frequency of the stabilizing pulses applied to said first stage, a selective filter, means for applying the beat frequency from said first stage through said filter to said second stage to mix therein with said additional stabilizing pulses, and means coupled to said frequency corrector for deriving a control voltage from the output of said selective filter and from the output of said second mixing stage, whereby the frequency of the local oscillator is automatically stabilized with respect to the stabilizing pulses.

2. Apparatus, as set forth in claim 1, wherein said stable oscillator is a crystal-controlled oscillator and wherein said circuit means further includes a frequency multiplier.

3. Apparatus, as set forth in claim 2, wherein said stable oscillator produces a sine oscillation, wherein said means for applying additional stabilizing pulses further includes a first pulse generator interposed between said stable oscillator and said second mixing stage, and wherein said circuit means still further includes a second pulse generator and said frequency multiplier comprising a distorting amplifying stage for producing a sine wave oscillation which controls said pulse generator.

References Cited in the file of this patent

UNITED STATES PATENTS

| | | |
|---|---|---|
| 2,581,594 | MacSorley | Jan. 8, 1952 |
| 2,595,608 | Robinson | May 6, 1952 |